(12) United States Patent  
Van Zyl

(10) Patent No.: US 10,314,156 B2  
(45) Date of Patent: *Jun. 4, 2019

(54) SWITCHING AMPLIFIER

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

(*) Notice: Subject to any disclaimer, the term of this patent is extended or adjusted under 35 U.S.C. 154(b) by 0 days.

This patent is subject to a terminal disclaimer.

(21) Appl. No.: 15/716,148

(22) Filed: Sep. 26, 2017

(65) Prior Publication Data

US 2018/0146538 A1    May 24, 2018

Related U.S. Application Data

(63) Continuation of application No. 15/177,662, filed on Jun. 9, 2016, now Pat. No. 9,807,863.

(51) Int. Cl.
  *H03F 3/217*  (2006.01)
  *H05H 1/46*   (2006.01)
  *H03F 3/193*  (2006.01)

(52) U.S. Cl.
  CPC .............. *H05H 1/46* (2013.01); *H03F 3/193* (2013.01); *H03F 3/2171* (2013.01);
  (Continued)

(58) Field of Classification Search
  CPC ......... H05H 1/46; H03F 3/193; H03F 3/2173; H03F 3/217; H03F 3/2171;
  (Continued)

(56) References Cited

U.S. PATENT DOCUMENTS 6,031,746 A * 2/2000 Steigerwald .......... H03F 3/2171  
                                                    323/225  
6,172,558 B1   1/2001 Nowak et al.  
(Continued)

OTHER PUBLICATIONS

O'Dowd, Sean R., "Response to Ex-Parte Quayle Action Re U.S. Appl. No. 15/177,662", May 18, 2017, p. 5 Published in: US.

(Continued)

*Primary Examiner* — Khanh V Nguyen  
(74) *Attorney, Agent, or Firm* — Neugeboren O'Dowd PC

(57) ABSTRACT

A RF amplifier is provided that includes a plurality of switch modules connected in a cascade configuration and divided into disjoint sets in accordance with their corresponding distinct peak DC voltages or currents, each switch module including a plurality of switch devices connected in a half-bridge or full-bridge circuit and a DC voltage or current source electrically connected with the half-bridge or full-bridge circuit, and a control circuit configured to determine an output voltage or current of the RF amplifier at the next switching interval, examine the states of the switching devices in the respective switch modules to identify a combination of least-recently-switched switching devices within each set of switch modules that, when switched to an opposite state, will produce the determined output voltage or current, and switch to an opposite state, at the next switching interval, the switching devices in the identified combination.

19 Claims, 11 Drawing Sheets

(52) U.S. Cl.
CPC ........... *H03F 3/2173* (2013.01); *H03F 3/217* (2013.01); *H03F 2200/171* (2013.01); *H03F 2200/387* (2013.01); *H03F 2200/451* (2013.01); *H05H 2001/4645* (2013.01); *H05H 2001/4682* (2013.01)

(58) Field of Classification Search
CPC ........ H03F 2200/432; H03F 1/04; H03F 3/38; H03F 1/34; H03F 1/0277; H03F 3/72; H03F 1/3217; H03F 3/00; H03F 3/26; H03G 1/0088
USPC .......................................... 330/72, 146, 175
See application file for complete search history.

(56) References Cited

U.S. PATENT DOCUMENTS

| | | | |
|---|---|---|---|
| 7,116,166 | B2 | 10/2006 | Sabate et al. |
| 8,040,183 | B1* | 10/2011 | Cripe .................. H03F 3/2173 330/251 |
| 8,502,539 | B2 | 8/2013 | Lai et al. |
| 9,257,848 | B2 | 2/2016 | Coccia et al. |
| 2016/0099693 | A1 | 4/2016 | Sung |

OTHER PUBLICATIONS

Nguyen, Khanh V., "United States Office Action Re U.S. Appl. No. 15/177,662", dated Mar. 24, 2017, p. 17, Published in: US.

Fotouhi, R., Leitner, L., & Kennel, R., "An Efficient Method to Calculate Optimal Pulse Patterns for Medium Voltage Converters", "Industrial Electonics Society", Feb. 26, 2015.

Visser, A.J., Enslin, J.H.R., & Mouton, H.T., "Transformerless Series Sag Compensation with a Cascaded Multilevel Inverter", "IEEE Transactions on Industrial Electonics", Aug. 1, 2002, pp. 824-831, vol. 49, No. 4.

\* cited by examiner

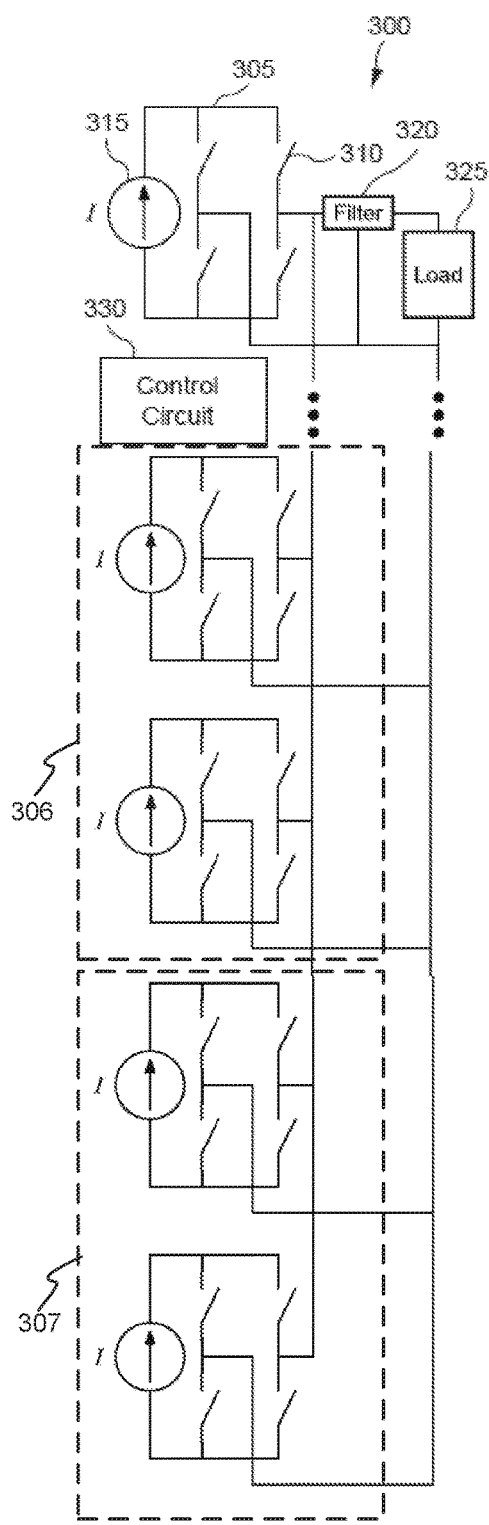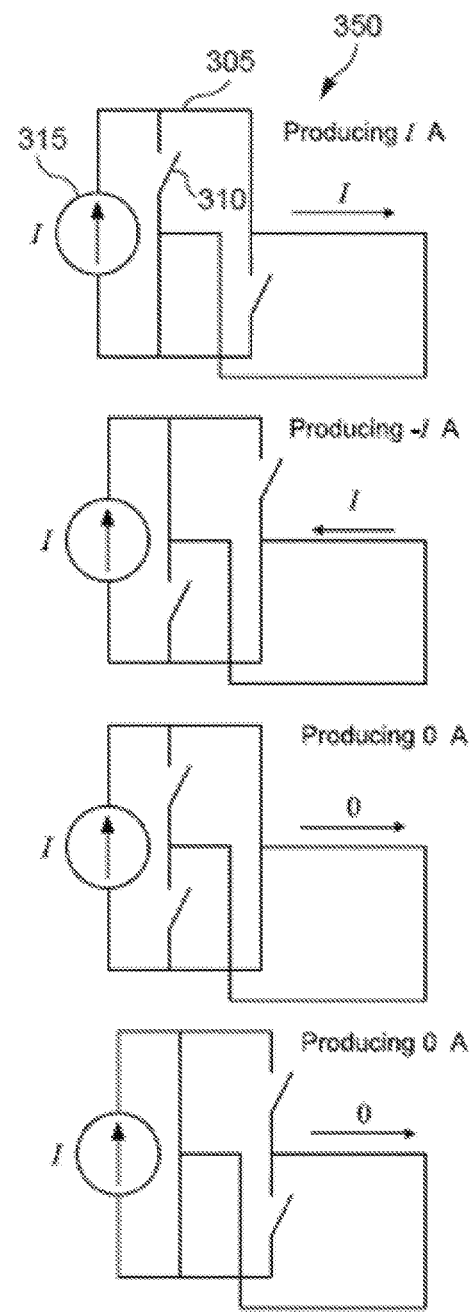
FIG. 3A
FIG. 3B

SWITCHING AMPLIFIER

CLAIM OF PRIORITY UNDER 35 U.S.C. § 120

The present Application for patent is a Continuation of patent application Ser. No. 15/177,662 entitled "SWITCHING AMPLIFIER" filed Jun. 9, 2016, pending, and assigned to the assignee hereof and hereby expressly incorporated by reference herein.

BACKGROUND

Field

The present disclosure relates generally to switching amplifiers, and, more specifically, to high-power, high-efficiency, broadband DC to RF switching amplifiers.

Background

RF amplifiers with active devices acting as current sources, such as the well-known Class A, B, and C amplifiers, cannot achieve 100 percent efficiency. To achieve a theoretical efficiency limit of 100 percent, the active devices need to act as switches that are either on or off, thus eliminating resistive losses in the switches. Examples of such amplifiers are the well-known Class D, E, and F amplifiers.

Class D, E, and F switched amplifiers generate voltages or currents over or through the device that are not sinusoidal and, thus, require filters to generate a spectrally pure sinewave output. The need for the output filter makes it difficult to design an amplifier that can generate power from a very low frequency (including possibly direct current (DC) operation) to some maximum radio frequency (RF). For example, to operate at a frequency of 1 MHz generally requires an output filter that suppresses the third and higher harmonics. That is, the output filter needs to allow 1 MHz to pass but reject frequencies from 3 MHz to, say, 100 MHz. This means that the same amplifier will not be able to operate efficiently at 10 MHz because 10 MHz is being rejected by the output filter. This problem can be overcome by keeping the switching frequency high and modulating the switch waveform to generate the desired output frequency. This gives rise to the Class S amplifier.

One limitation of the Class S amplifier is that switching losses can be high in actual implementations. A significant portion of switching losses is due to the output capacitance that is inherent in all known semiconductor switches. When the device switches from the off state to the on state with a voltage over the device, the energy stored in the output capacitance of the device is dissipated in the switch. The Class E amplifier includes an output filter designed such that, in the ideal case, the device never switches on when there is a voltage over the device. With Class D amplifiers, controlling the dead time and inductive pre-loading can achieve zero-voltage switching. However, in the case of the Class S amplifier, the switching frequency is generally higher than the frequency of the output, so the switching occurs at a variety of voltages over the device, and it is generally not possible to avoid these losses by clever design of the output filter. Most semiconductor devices have output capacitances that decrease approximately as the square root of the applied voltage so that the stored energy is approximately proportional to the applied voltage. In addition to capacitive switching losses, there are also losses associated with the time it takes to turn the device fully on or off. During the transition time, both voltage over and current through the switch are present at the same time, leading to losses. These losses are also approximately proportional to the maximum voltage over the device during the transition.

It is thus apparent that there is a need in the art for an improved broadband switching amplifier.

SUMMARY

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

An aspect is a RF amplifier that includes a plurality of switch modules connected in a cascade configuration and divided into disjoint sets in accordance with their corresponding distinct peak DC voltages, each switch module including a plurality of switch devices connected in a half-bridge or full-bridge circuit and a DC voltage source electrically connected with the half-bridge or full-bridge circuit, and a control circuit configured to determine an output voltage of the RF amplifier at the next switching interval, examine the states of the switching devices in the respective switch modules to identify a combination of least-recently-switched switching devices within each set of switch modules that, when switched to an opposite state, will produce the determined output voltage, and switch to an opposite state, at the next switching interval, the switching devices in the identified combination.

Another aspect is a RF amplifier that includes a plurality of switch modules connected in a parallel configuration and divided into disjoint sets in accordance with their corresponding distinct peak DC (direct current), each switch module including a plurality of switch devices connected in a half-bridge or full-bridge circuit and a DC current source electrically connected with the half-bridge or full-bridge circuit, and a control circuit configured to determine an output current of the RF amplifier at the next switching interval, examine the states of the switching devices in the respective switch modules to identify a combination of least-recently-switched switching devices within each set of switch modules that, when switched to an opposite state, will produce the determined output current, and switch to an opposite state, at the next switching interval, the switching devices in the identified combination.

BRIEF DESCRIPTION OF THE DRAWINGS

FIGS. 3A and 3B are, respectively, a circuit diagram of a RF amplifier employing current sources and a diagram showing switch positions that produce particular output currents, in accordance with an embodiment of this disclosure;

DETAILED DESCRIPTION

Figure 1:
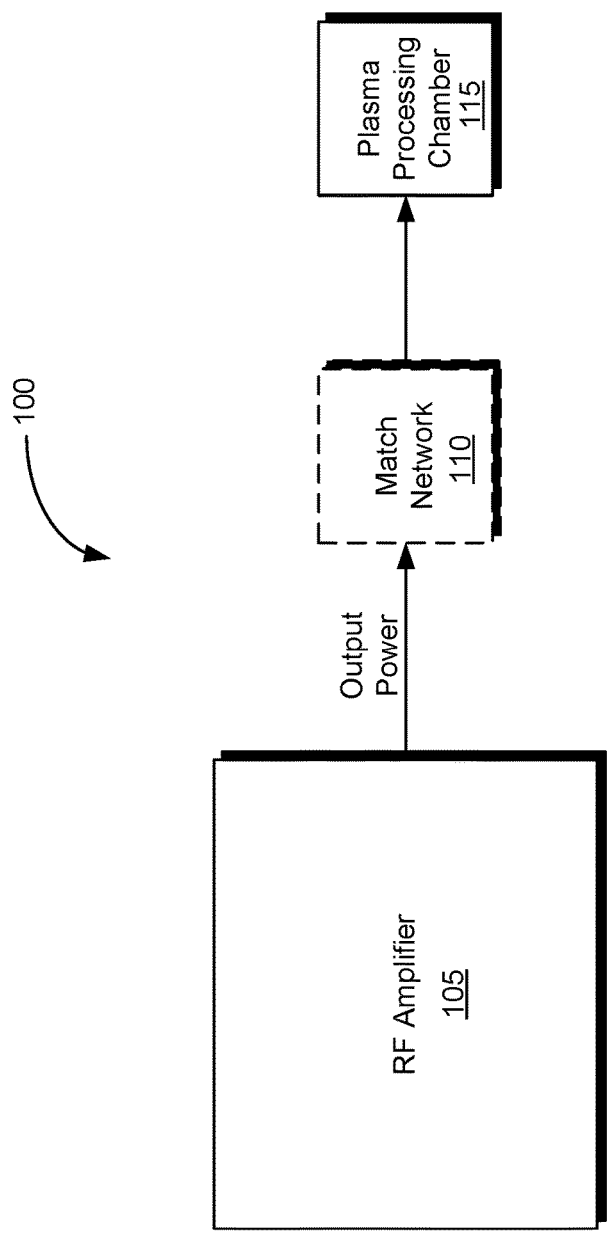
FIG. 1 is a high-level block diagram of a plasma processing system in accordance with an embodiment of this disclosure.

The cascaded multi-level inverter that is well known in the field of power electronics provides a means of reducing the voltage over the switches. In this design, a number of half- or full-bridge circuits, each having an associated isolated direct-current (DC) power supply, are connected in series (cascaded). If a stack of N full-bridge circuits are used, each with a DC supply of $V_{dc}$ volts, the multi-level inverter can produce a voltage of $\pm N \times V_{dc}$, and it is possible to achieve an overall switching frequency N times higher than the frequency at which each bridge is switched.

Since switching losses are approximately proportional to the applied voltage and to the switching frequency, cascading N full-bridge circuits can decrease switching losses in each device by a factor of $N^2$ and overall switching losses by a factor of N. Of course, since there are now more devices in series to produce the same voltage, resistive losses increase by a factor N, but in many cases switching losses are much higher than resistive losses.

In the field of power electronics, the cascaded multi-level inverter typically produces outputs of 50 or 60 Hz. Using this topology as a radio-frequency (RF) amplifier introduces additional problems. One problem for RF operation is that the current through the switching devices (e.g., transistors) can flow in any direction when the state of the half- or full-bridge circuit needs to be changed to produce the correct voltage. For most semiconductor switches, there is a fairly long recovery time for the intrinsic diode of the device. If current is flowing in the wrong direction, turning the switch off forces current through the intrinsic diode, making it impossible for the switch to sustain any significant voltage and impossible (unless the devices used can handle the dissipation associated with recovering the intrinsic diode) to turn on the opposing switch to change the voltage produced by the bridge circuit. The energy associated with intrinsic-diode recovery times the frequency at which this happens yields the additional losses that must be handled in the switching devices. Going from 60 Hz to, say, 6 MHz increases this problem $10^5$-fold. This problem can be avoided by using zero-recovery (e.g. silicon carbide) series and anti-parallel diodes, but it makes the design impractical, in many cases. The availability of GaN high-electron-mobility-transistor (HEMT) devices, which have no reverse recovery, makes a multi-level-inverter topology attractive for RF applications. There are many practical problems such as dealing with the high rates of change in voltage (dV/dt) and needing to provide DC supplies and gate drives to the switches that can deal with the high dV/dt, but GaN HEMT devices render the design feasible.

In addition to the choice of switching devices, the control scheme to achieve a desired output needs to be adapted to make the cascaded multi-level inverter attractive as a RF amplifier. In the field of power electronics, there is no need to precisely control the output voltage. Using the multi-level inverter as a RF amplifier typically requires the output power to be controlled down to 0.1 percent of full-rated output power. A control scheme for accomplishing this is described below.

The basic idea of breaking the total voltage to be produced into smaller increments and cascading sections to produce the full voltage can also be used to break the total current into smaller increments and paralleling stages to produce the full output power. Such an approach is useful to, e.g., deliver power to a very low-impedance load. Examples of parallel-current-source embodiments are described below.

One application for an improved RF switching amplifier is supplying power to a plasma load in a plasma processing chamber. FIG. 1 is a high-level block diagram of a plasma processing system 100 in accordance with an embodiment of this disclosure. In FIG. 1, RF amplifier 105 drives a plasma load (not shown) in plasma processing chamber 115. For example, RF amplifier 105 can be part of a RF generator in a plasma-processing environment. Optionally, depending on the particular embodiment, an impedance-matching network 110 may be interposed between RF amplifier 105 and the plasma load, as shown in FIG. 1.

Figures 2A, 2B:
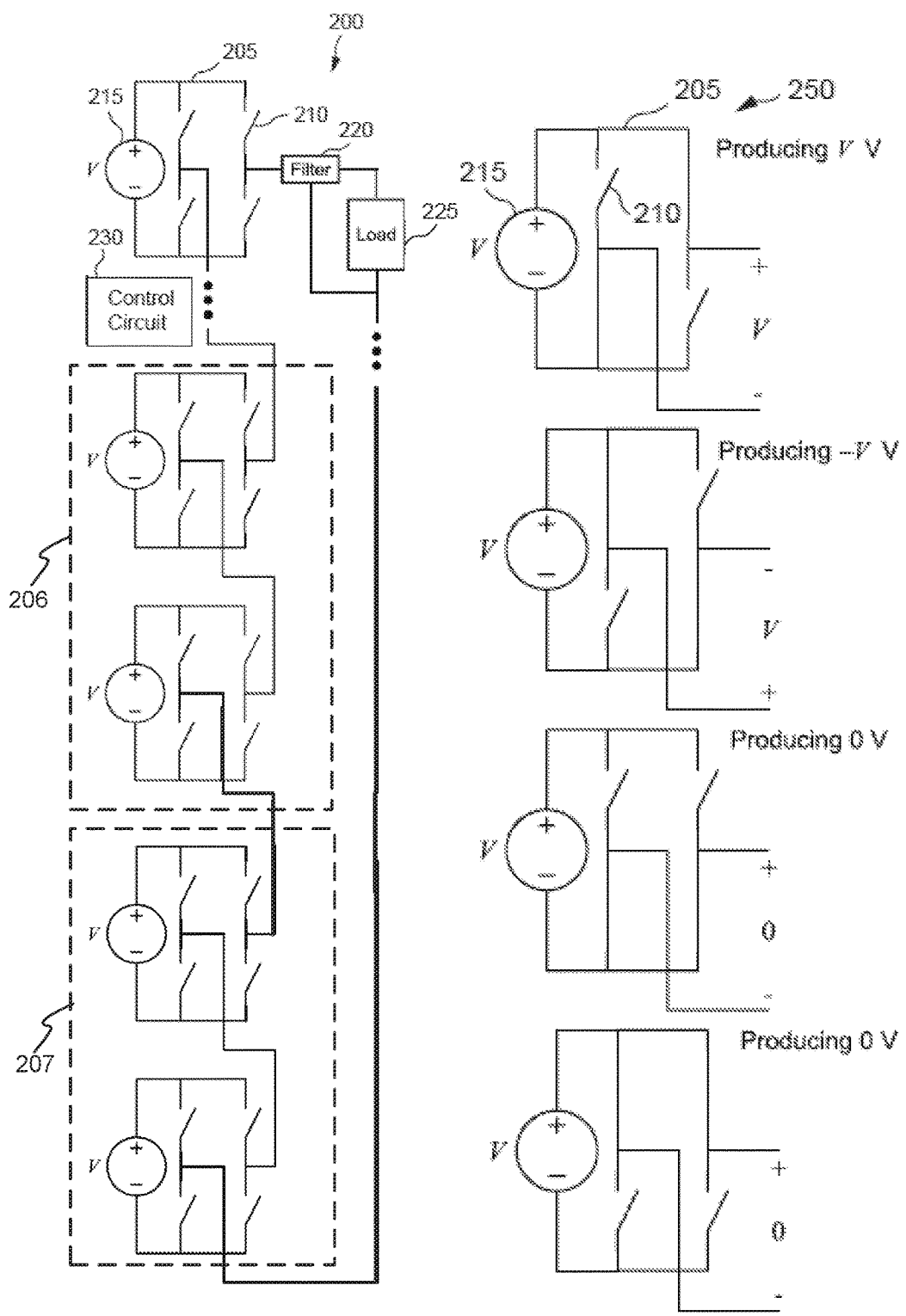
FIGS. 2A and 2B are, respectively, a circuit diagram of a RF amplifier employing voltage sources and a diagram showing switch positions that produce particular output voltages, in accordance with an embodiment of this disclosure.

FIGS. 2A and 2B are, respectively, a circuit diagram of a RF amplifier 200 employing voltage sources and a diagram 250 showing switch positions that produce particular output voltages, in accordance with an embodiment of this disclosure.

FIG. 2A depicts a RF amplifier 200 that includes a basic cascaded multi-level inverter employing voltage sources and full-bridge circuits. The RF amplifier includes multiple switch modules 205 connected in a cascade (series) configuration. In this embodiment, each switch module 205 includes four switching devices 210 electrically interconnected in a full-bridge circuit and electrically connected with a DC voltage source 215. An output filter 220 (e.g., a low-pass or band-pass filter) is electrically connected between the output terminals of RF amplifier 200 and load 225. Control circuit 230 controls the switching (state changes) of switching devices 210 to change the voltage produced by each switch module 205 as needed during operation. Though, for simplicity, FIG. 2A shows no connections between control circuit 230 and the switching devices 210, there are, in reality, control lines connecting control circuit 230 with the gates of the respective switching devices 210 (e.g., MOSFET or GaN HEMT devices). Each switching device 210 has an associated "off" state and an associated "on" state. Diagram 250 in FIG. 2B shows the various switch positions in switching modules 205 that produce the indicated voltage levels.

To produce the needed output-voltage resolution, the switch modules 205 are, in this embodiment, divided into disjoint sets (for example, a first set 206 and a second set 207, each set of switch modules 205 having a corresponding distinct peak DC voltage. That is, each DC voltage source 215 in a given set of switch modules 205 is configured to produce the same distinct peak DC voltage, and that distinct peak DC voltage is different from that of any other set of switch modules 205.

The number of switch modules 205 in a given set is determined by the frequency at which those switch modules can be switched. For example, if a maximum output voltage of 500 V is required and a 40-V stage can switch at a 10-MHz rate (meaning it can change state twice within a 10-MHz cycle) into the worst-case output voltage and load and a switching frequency of 28 MHz is required to produce the output, then 500/40×28/10=35 40-V stages may be required. Control circuit 230 can keep track of the states of the switching devices 210 in the respective switch modules 205 of each set and cycle through the switch modules 205 within each set to equalize power dissipation amongst the available switch modules in that set. That is, the least-recently-switched switching devices 210 within each set of switch modules 205 can be switched to their opposite states at each switching interval. Since switching loses are approximately proportional to voltage and switching losses are typically much larger than conduction losses, fewer lower-voltage switch modules 205 are typically required. For example, a design requiring 35 40-V switch modules 205 may require 18 20-V switch modules 205, 9 10-V switch modules 205, 5 5-V switch modules 205, etc.

Several observations can be made regarding the example just mentioned. First, it illustrates that a first distinct peak DC voltage corresponding to a first set of switch modules (e.g., 40 V in the example above) can be an integer multiple of a second distinct peak DC voltage corresponding to a second set of switch modules (20 V in the example above). Second, the above example illustrates that a distinct peak DC voltage (e.g., 40 V), when multiplied by the number of switch modules belonging to the applicable set, can exceed the maximum voltage the RF amplifier is designed to produce. Specifically, 35×(40 V)=1400 V, which exceeds the maximum intended output voltage of 500 V for the RF amplifier discussed above. Third, a second distinct peak DC voltage (e.g., 20 V), when multiplied by the number of switch modules belonging to the applicable set (18, in the above example), can exceed a first distinct peak DC voltage associated with a different set of switch modules (e.g., 40 V). Specifically, 18×(20 V)=360 V, which exceeds 40 V. These same observations apply analogously to embodiments employing current sources and switch modules connected in a parallel configuration, which are discussed further below.

The lowest non-zero-amplitude harmonic in the switch waveform is a function of the ratio of the switching frequency to the output frequency. By changing the ratio as a function of output frequency, the lowest frequency component that needs to be filtered can be controlled. The information summarized in Table 1 assumes the sine function sampled at intervals of π/N starting at 0, if N is even, and at π/(2N), if N is odd, where $N = f_{sw}/f_{out}$, $f_{out}$ is the output frequency of the generator, and $f_{sw}$ is the switching frequency. Note that $f_{sw}$ is half the rate at which the switch modules 205 change state. With a switching scheme as summarized in Table 1, the frequency at which control pulses for the switches need to be generated is limited to 6×12=72 MHz.

TABLE 1

Switching Frequency as a Function of Output Frequency

| $f_{out}$ (MHz) | $f_{sw}/f_{out}$ | max($f_{sw}$) (MHz) | 1st Non-Zero Harmonic | Smallest Non-Zero Harmonic Frequency (MHz) | 1st Non-Zero Harmonic Level (dBc) |
|---|---|---|---|---|---|
| <1 | $f_{sw}$ = 28 MHz | 28 | NA | NA | NA |
| 1 to 1.34 | 20 | 26.8 | 39th | 39 | −31.8 |
| 1.34 to 1.9 | 14 | 26.6 | 27th | 36.2 | −28.6 |
| 1.9 to 2.8 | 10 | 28 | 19th | 36.1 | −25.6 |
| 2.8 to 4 | 7 | 28 | 13th | 36.4 | −22.3 |
| 4 to 5.2 | 5 | 26 | 9th | 36 | −19.1 |
| 5.2 to 7.2 | 4 | 28.8 | 7th | 36.4 | −16.9 |
| 7.2 to 12 | 3 | 36 | 5th | 36 | −14.0 |
| 12 to 14.238 | 1 | 14.238 | 3rd | 36 | −9.5 |

Referring again to Table 1, the values of the ratio $f_{sw}/f_{out}$ shown in the second column from the left may be termed $k_i$ for $i \in \{1, 2, \ldots, N\}$, where N is the number of different output-frequency ranges in which the RF amplifier is designed to operate (corresponding to the rows of Table 1). The various output frequencies defining the lower limits of the frequency ranges in the leftmost column of Table 1 can then be represented as $f_{k_i}$. With this notation in mind, there is an output frequency of the RF amplifier $f_{k_1}$ (12 MHz in Table 1) above which the switching devices change state twice within each output cycle, and there is a decreasing sequence of frequencies $\{f_{k_1}, f_{k_2}, \ldots f_{k_N}\}$ (12, 7.2, 5.2, 4, 2.8, 1.9, 1.34, and 1 MHz, respectively, in Table 1) such that the switching devices change state $2 \times k_{(m+1)}$ times within each output cycle for output frequencies between $f_{k_{(m+1)}}$ and $f_{k_m}$ for $m \in \{1, 2, \ldots, N-1\}$.

In some embodiments, hysteresis is applied to the values of the boundary frequencies $\{f_{k_1}, f_{k_2}, \ldots f_{k_N}\}$ so that small changes (e.g., less than 10 percent of $f_{k_i}$) in the vicinity of one of the $f_{k_i}$ do not result in a frequent change in the ratio of the switching frequency to the output frequency ($f_{sw}/f_{out}$). Applying hysteresis in this manner increases the stability of the ratio $f_{sw}/f_{out}$ during operation of the RF amplifier.

As mentioned above, embodiments of an improved switching amplifier are also possible, and even desirable, in a parallel-current-source configuration. FIGS. 3A and 3B are, respectively, a circuit diagram of a RF amplifier 300 employing current sources and a diagram showing switch positions that produce particular output currents, in accordance with an embodiment of this disclosure.

FIG. 3A depicts a RF amplifier 300 that includes a basic multi-level inverter employing current sources and full-bridge circuits. RF amplifier 300 includes multiple switch modules 305 connected in a parallel configuration. In this particular embodiment, each switch module 305 includes four switching devices 310 electrically interconnected in a full-bridge circuit and electrically connected with a DC current source 315. An output filter 320 (e.g., a low-pass or band-pass filter) is electrically connected between the output terminals of RF amplifier 300 and load 325.

It should be noted that, in cascaded embodiments (see, e.g., FIG. 2A), the switching devices 210 need to block voltage in only one direction, whereas, with the parallel-connected multi-level inverter shown in FIG. 3A, the switching devices 310 need to block voltage in both directions, thus typically requiring diodes (not shown in FIG. 3A) in series with semiconductor switches.

As with the cascaded embodiment discussed above in connection with FIGS. 2A and 2B, a control circuit 330 controls the switching (state changes) of switching devices 310 to change the current output by each switch module 305 as needed during operation. Though, for simplicity, FIG. 3A shows no connections between control circuit 330 and the switching devices 310, there are, in reality, control lines connecting control circuit 330 with the gates of the respective switching devices 310 (e.g., MOSFET or GaN HEMT devices). Each switching device 310 has an associated "off" state and an associated "on" state. Diagram 350 in FIG. 3B shows the various switch positions in switching modules 305 that produce the indicated current levels.

As with the cascaded embodiment discussed above in connection with FIGS. 2A and 2B, in the parallel-current-source embodiment of FIG. 3A, the switch modules 305 are divided into disjoint sets (for example, a first set 306 and a second set 307, each set of switch modules 305 having a corresponding distinct peak DC (direct current). That is, each DC current source 315 in a given set of switch modules 305 is configured to produce the same distinct peak DC, and that distinct peak DC is different from that of any other set of switch modules 305.

Figure 4:
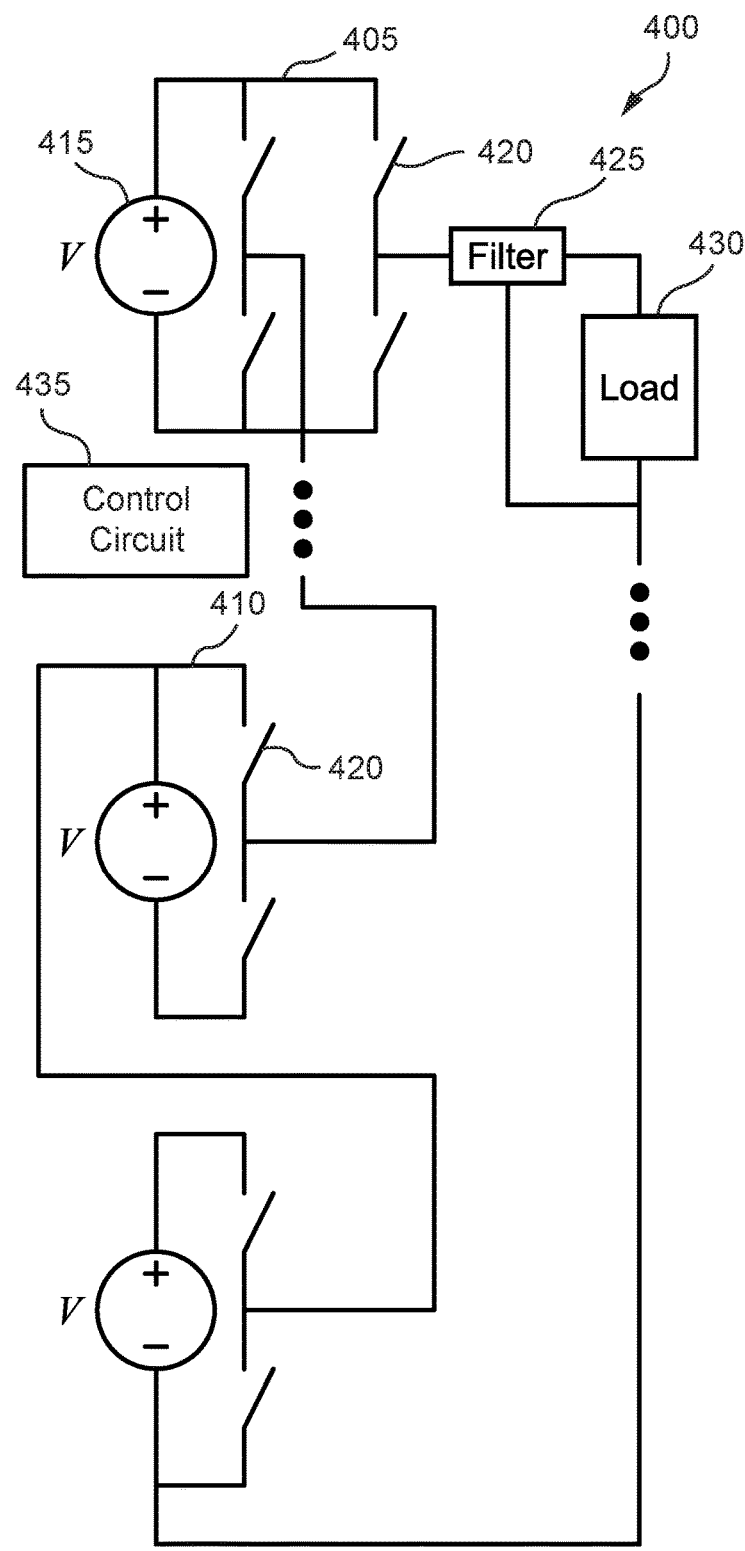
FIG. 4 is a circuit diagram of a RF amplifier employing both half- and full-bridge switch modules with voltage sources, in accordance with an embodiment of this disclosure.

Though the embodiments discussed thus far employ full-bridge circuits for the switching devices, half-bridge circuits or a mixture of full- and half-bridge circuits can be used instead. For example, FIG. 4 is a circuit diagram of a RF amplifier 400 employing both half- and full-bridge switch modules with voltage sources, in accordance with an embodiment of this disclosure. In this embodiment, full-bridge switch modules 405 and half-bridge switch modules 410 are connected in cascade (series) fashion, as in FIGS. 2A and 2B.

In the embodiment shown in FIG. 4, each full-bridge switch module 405 includes four switching devices 420 electrically interconnected in a full-bridge circuit and electrically connected with a DC voltage source 415. Each half-bridge switch module 410 includes two switching devices 420 electrically connected in a half-bridge circuit and electrically connected with a DC voltage source 415. An output filter 425 (e.g., a low-pass or band-pass filter) is electrically connected between the output terminals of RF amplifier 400 and load 430. As in the other embodiments discussed above, a control circuit 435 controls the switching (state changes) of switching devices 420 to change the voltage produced by each switch module 405 or 410 as needed during operation. Though, for simplicity, FIG. 4 shows no connections between control circuit 435 and the switching devices 420, there are, in reality, control lines connecting control circuit 435 with the gates of the respective switching devices 420 (e.g., MOSFET or GaN HEMT devices). Each switching device 420 has an associated "off" state and an associated "on" state.

Figure 5:
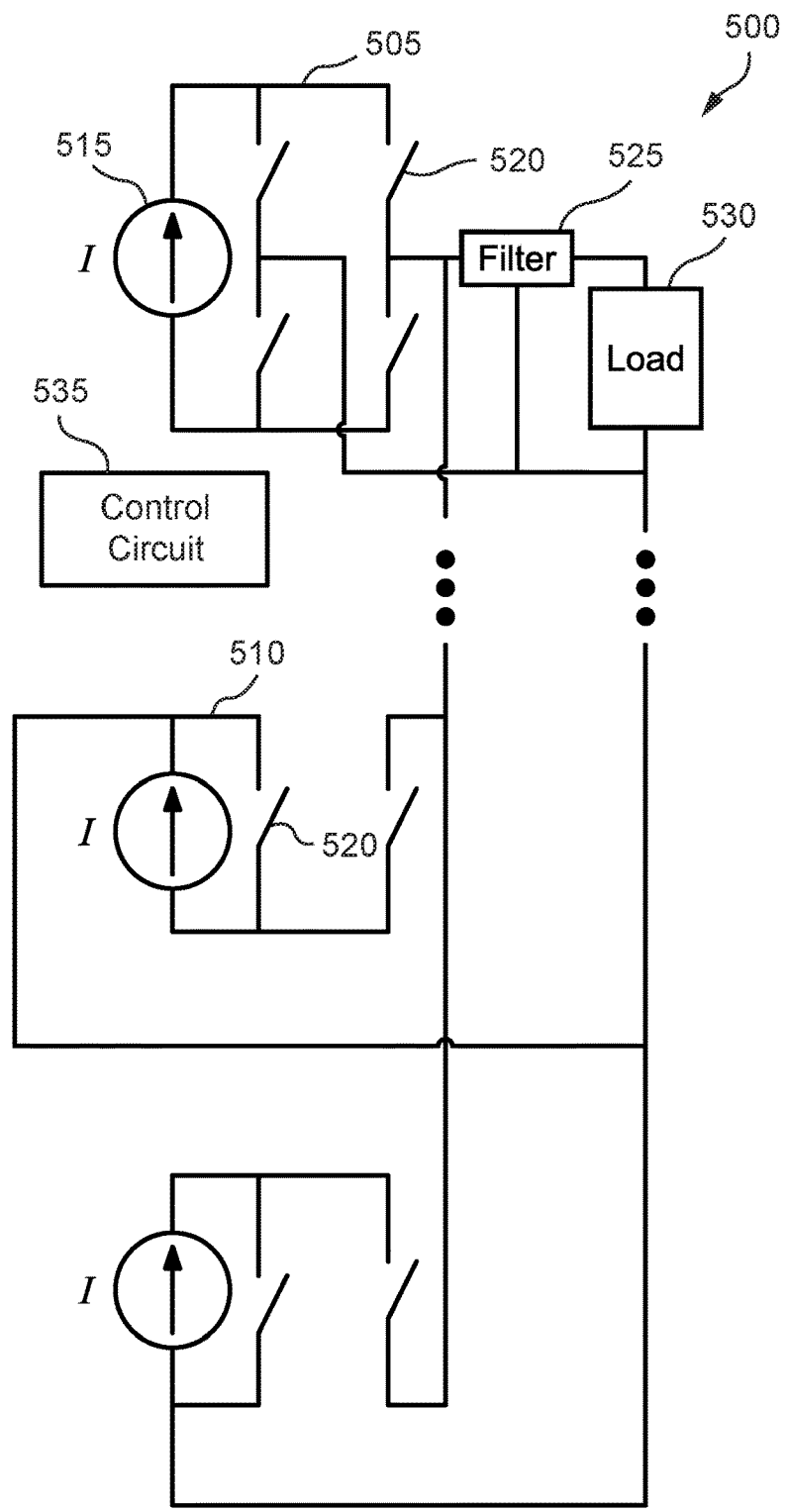
FIG. 5 is a circuit diagram of a RF amplifier employing both half- and full-bridge switch modules with current sources, in accordance with an embodiment of this disclosure.

FIG. 5 is a circuit diagram of a RF amplifier 500 employing both half- and full-bridge switch modules with current sources, in accordance with an embodiment of this disclosure. In this embodiment, full-bridge switch modules 505 and half-bridge switch modules 510 are connected in parallel fashion, as in FIGS. 3A and 3B. In the embodiment shown in FIG. 5, each full-bridge switch module 505 includes four switching devices 520 electrically interconnected in a full-bridge circuit and electrically connected with a DC current source 515. Each half-bridge switch module 510 includes two switching devices 520 electrically connected in a half-bridge circuit and electrically connected with a DC current source 515. An output filter 525 (e.g., a low-pass or band-pass filter) is electrically connected between the output terminals of RF amplifier 500 and load 530. As in the other embodiments discussed above, a control circuit 535 controls the switching (state changes) of switching devices 520 to change the current produced by each switch module 505 or 510 as needed during operation. Though, for simplicity, FIG. 5 shows no connections between control circuit 535 and the switching devices 520, there are, in reality, control lines connecting control circuit 535 with the gates of the respective switching devices 520 (e.g., MOSFET or GaN HEMT devices). Each switching device 520 has an associated "off" state and an associated "on" state.

Figure 6:
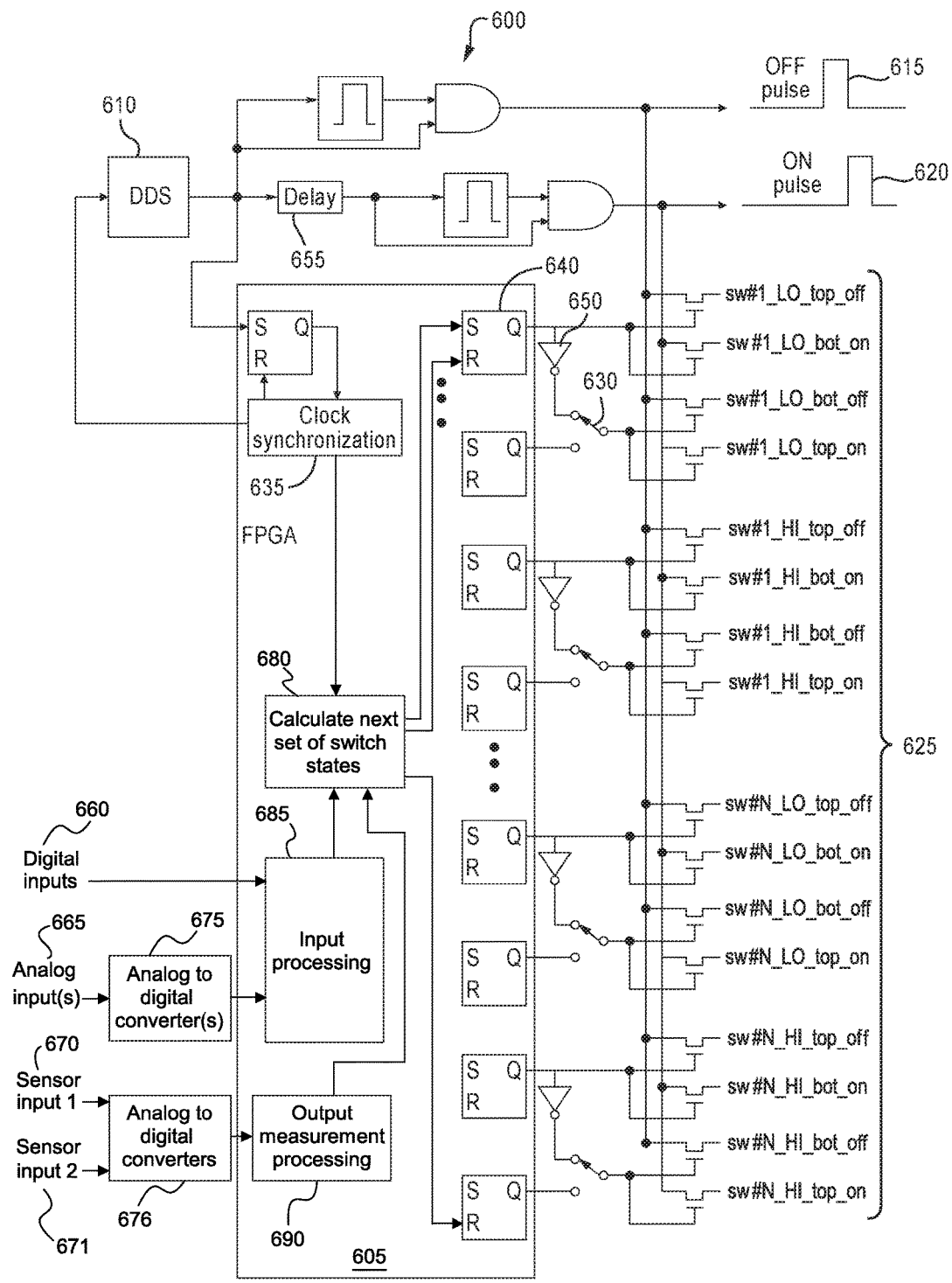
FIG. 6 is a schematic diagram of a control circuit in accordance with an embodiment of this disclosure.

FIG. 6 is a schematic diagram of a control circuit 600 in accordance with an embodiment of this disclosure. FIG. 6 illustrates an architecture for implementing a control circuit such as control circuits 230, 330, 435, or 535 discussed above in connection with FIGS. 2A, 3A, 4, and 5, respectively.

The embodiment in FIG. 6 implements the switching logic as a field-programmable gate array (FPGA) 605. FPGA 605 includes logic for deciding which switching devices (210, 310, 420, 520) need to be turned on and which need to be turned off at a given switching interval. To calculate the required switch states, the FPGA receives inputs about the desired output. This can take the form of digital inputs 660 or analog inputs 665 processed by an analog-to-digital converter 675. The desired output can be a waveform as a function of time, be it load voltage, load current, or a combination of load voltage and current; or a desired characteristic of power delivered to the load such as RMS load voltage or current, delivered power, or forward power. Inputs are processed by input processing element 685. The actual output is measured with a sensor (not shown), and the sensor outputs 670 and 671 are converted to digital signals with analog-to-digital converters before being processed by element 690. Sensor outputs 670 and 671 can be load voltage and current or combinations thereof such as forward voltage or reflected voltage or forward, reflected, or delivered load power. Decisions about the next switch state are made with element 680 based on the required and actual outputs, as determined in elements 685 and 690. Elements 680, 685, and 690 can be combined or split in various ways and can be implemented using synchronous or asynchronous logic or software executed in the FPGA or with the aid of an external microprocessor or digital signal processor. In FIG. 6, an "off" pulse 615 and an "on" pulse 620 are conveyed to the gates of the switching devices via control lines 625 through suitable isolation circuitry (not shown in FIG. 6) such as transformers or optical isolators. Control circuit 600 also includes a set of switches 630. In FIG. 6, the FPGA 605 outputs are represented as the outputs of a set of SR latches or flip flops 640. Those outputs are connected with the gates of a set of transistors 645, in some instances through an inverter 650. Control circuit 600 further includes a delay element 655 to create a timing offset between "off" pulses 615 and "on" pulses "620."

To turn a particular switching device (210, 310, 420, 520) on, the turning-on circuitry in control circuit 600 is pulsed. To turn a particular switching device off, the turning-off circuitry in control circuit 600 is pulsed (i.e., an opposing pulse is generated). It is important to note that, in cascaded-voltage-source embodiments such as those discussed above in connection with FIGS. 2A and 4, the opposing switching device must always be turned off first before the next switching device is turned on. For parallel-current-source embodiments such as those discussed above in connection with FIGS. 3A and 5, just the opposite is true: current needs to be turned on in the next switching device before current is turned off in the opposing device.

Direct digital synthesizer (DDS) 610 provides a clock signal for control circuit 600. DDS 610 could be any kind of oscillator, but it is advantageous to use a variable-frequency generator. Clock synchronization is handled by clock synchronization element 635. If all switching devices (210, 310, 420, 520) in the switch modules (205, 305, 405, 410, 505, 510) are switched at the DDS clock rate regardless of whether the state of a given switch module changes on the clock edge, two control lines 625 are required per full-bridge switch module. For example, for a design that includes 28 full-bridge switch modules, 56 FPGA control outputs would be needed. The timing from the FPGA is not critical, so long as the states of the control lines are set within the smallest DDS clock period of 13.9 ns, in this embodiment. If control pulses are issued only when necessary to change or maintain the state of a full-bridge switch module, four outputs per full-bridge switch module are required, meaning the above-mentioned embodiment that includes 28 full-bridge switch modules would require 112 control lines 625. Locking the switching clock to the output frequency dramatically lowers residual amplitude modulation and produces a much cleaner spectrum. Computer simulation results for this particular embodiment are presented below in connection with FIGS. 8-10.

Figure 7:
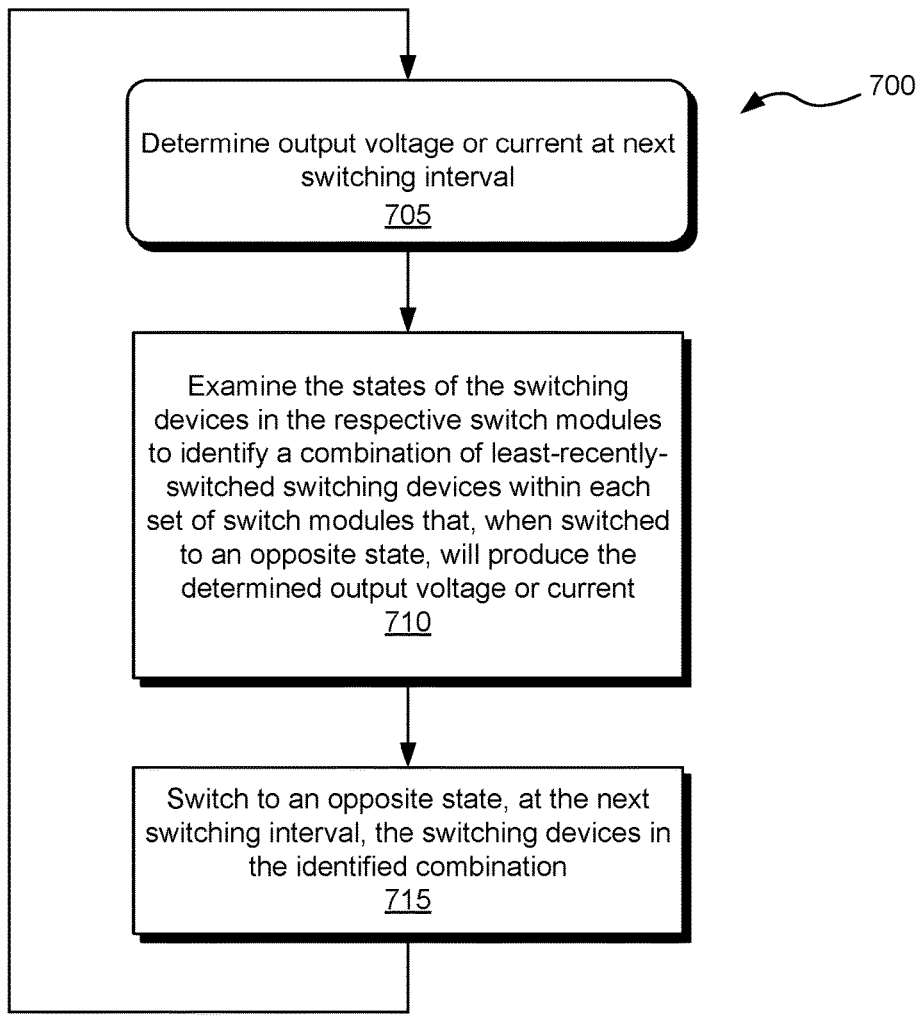
FIG. 7 is a flow chart of a method for controlling switching devices in the switch modules of a RF amplifier in accordance with an embodiment of this disclosure.

FIG. 7 is a flow chart of a method 700 for controlling switching devices in the switch modules of a RF amplifier in accordance with an embodiment of this disclosure. Method 700 can be carried out by a control circuit such as control circuit 600 described above in connection with FIG. 6 or another control-circuit embodiment (see FIG. 11). At Block 705, the control circuit determines what output voltage or current the RF amplifier should produce at the next switching interval. In the context of FIG. 7, a "switching interval" is an instant in time at which the states of the switch modules in the RF amplifier are changed by the control circuit. In some embodiments, the output of the RF amplifier is predetermined (e.g., a pure sinusoid), permitting the needed output voltage or current values to be stored in a lookup table. In other embodiments, the RF amplifier must amplify an arbitrary input waveform. In such an embodiment, the control circuit measures the input voltage or current at a particular time instant and determines what the corresponding amplified output voltage or current should be.

At Block 710, the control circuit examines the states of the switching devices in the respective switch modules to identify a combination of least-recently-switched switching devices within each set or category of switch modules that, when switched to their opposite state, will produce the output voltage or current determined at Block 705. At Block 715, the control circuit switches to an opposite state, at the next switching interval, the switching devices in the combination of switching devices identified at Block 710.

As indicated in FIG. 7, the control circuit performs the actions depicted in Blocks 705, 710, and 715 repeatedly while RF amplifier (e.g., 200, 300, 400, or 500) is in operation.

Figure 8:
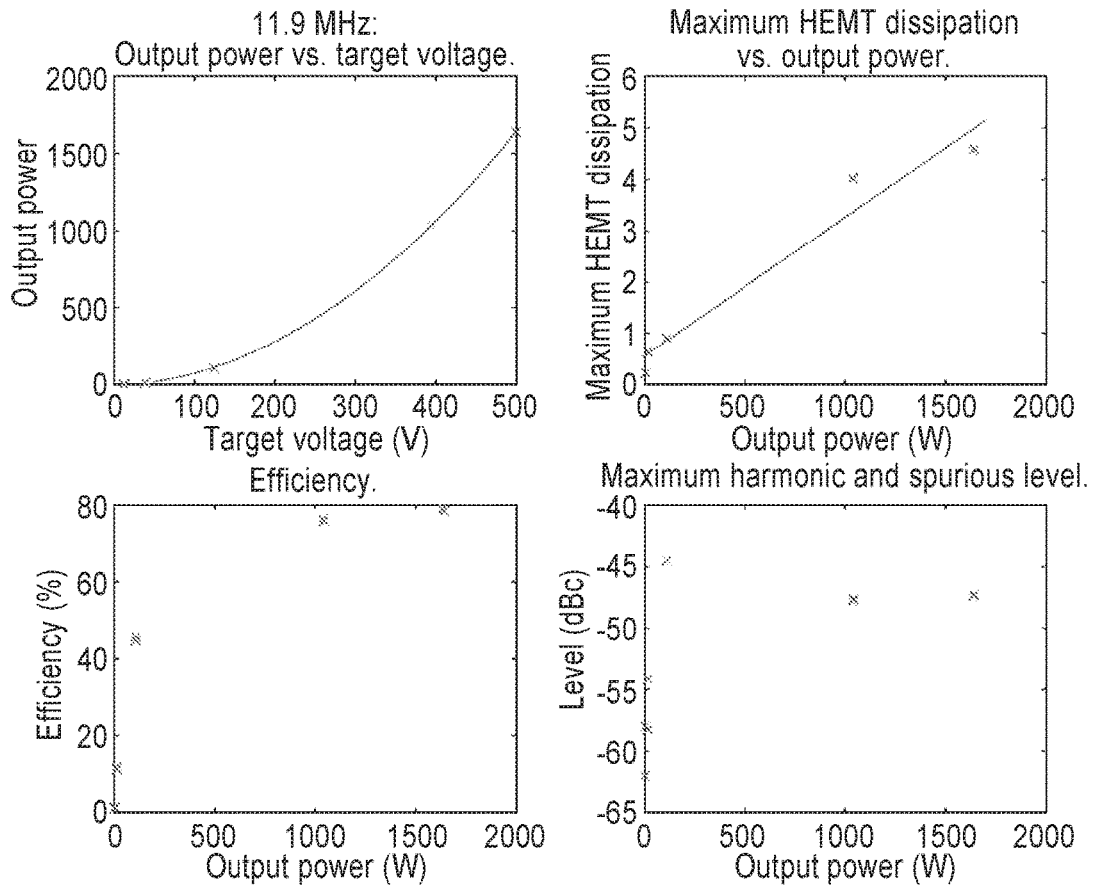
FIG. 8 is a summary of time-domain simulation results at 11.9 MHz into 50Ω, in accordance with an embodiment of this disclosure.
Figure 9:
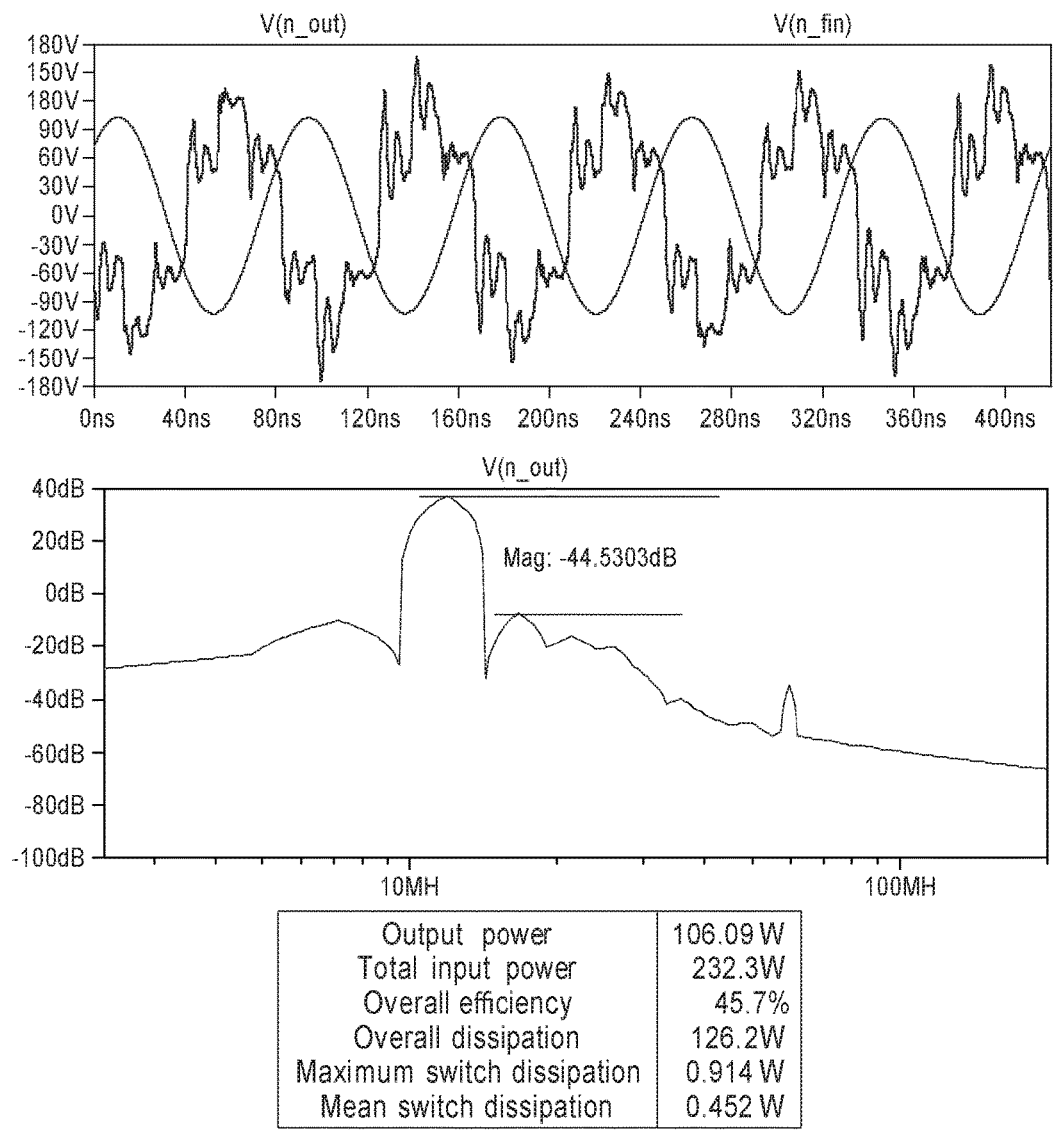
FIG. 9 is a summary of time-domain simulation results producing 106.09 W into 50Ω at 11.9 MHz, in accordance with an embodiment of this disclosure.
Figure 10:
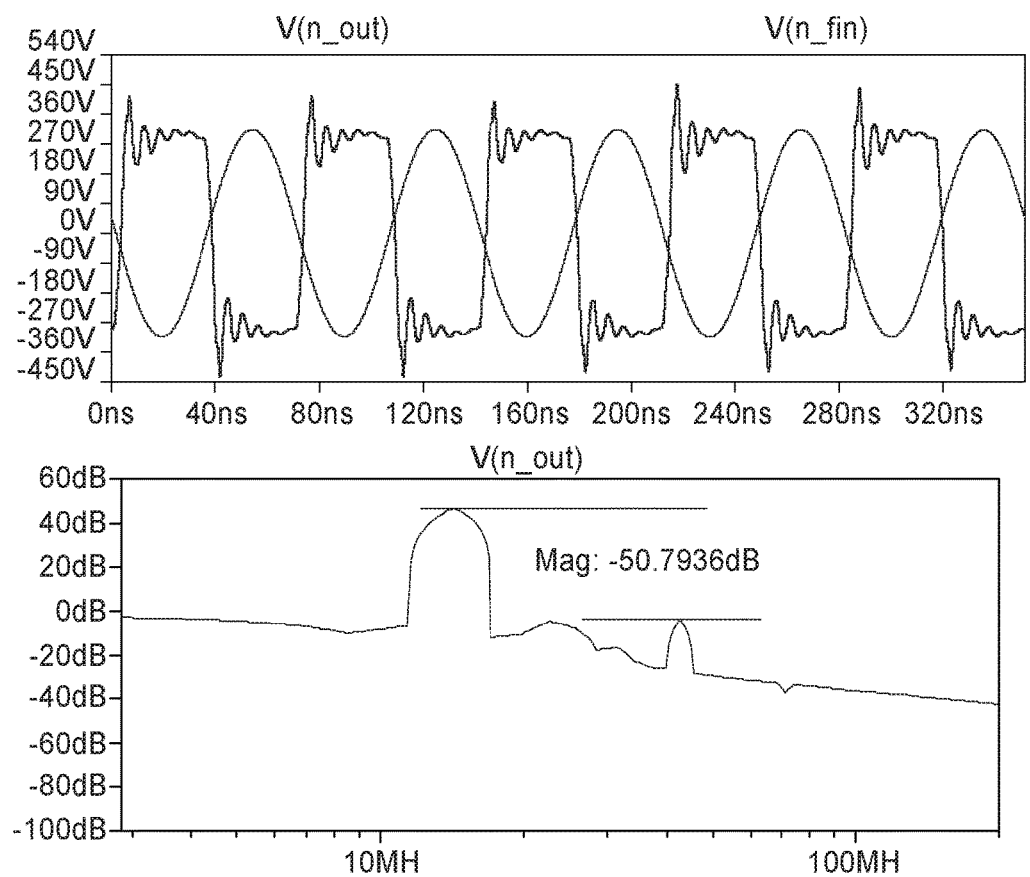
FIG. 10 is a summary of time-domain simulation results producing 989.45 W into 50Ω at 14.238 MHz, in accordance with an embodiment of this disclosure.

FIGS. 8-10 summarize simulation results of an RF amplifier in accordance with an embodiment described above in connection with FIG. 6 (an illustrative configuration including 28 switching stages) under varying conditions. FIG. 8 is a summary of time-domain simulation results at 11.9 MHz into 50Ω. FIG. 9 is a summary of time-domain simulation results producing 106.09 W into 50Ω at 11.9 MHz. FIG. 10 is a summary of time-domain simulation results producing 989.45 W into 50Ω at 14.238 MHz. The simulation results show that a design as disclosed is feasible using currently available devices. Operation at 11.9 MHz, as summarized in FIG. 8, results in the highest operating frequency for the switches and results in the highest HEMT dissipation. As shown in FIG. 8, HEMT dissipation is low enough to make this design practical. Operation at 14.238 MHz results in the highest harmonic content in the output. As shown in FIG. 10, harmonic levels are acceptable.

Figure 11:
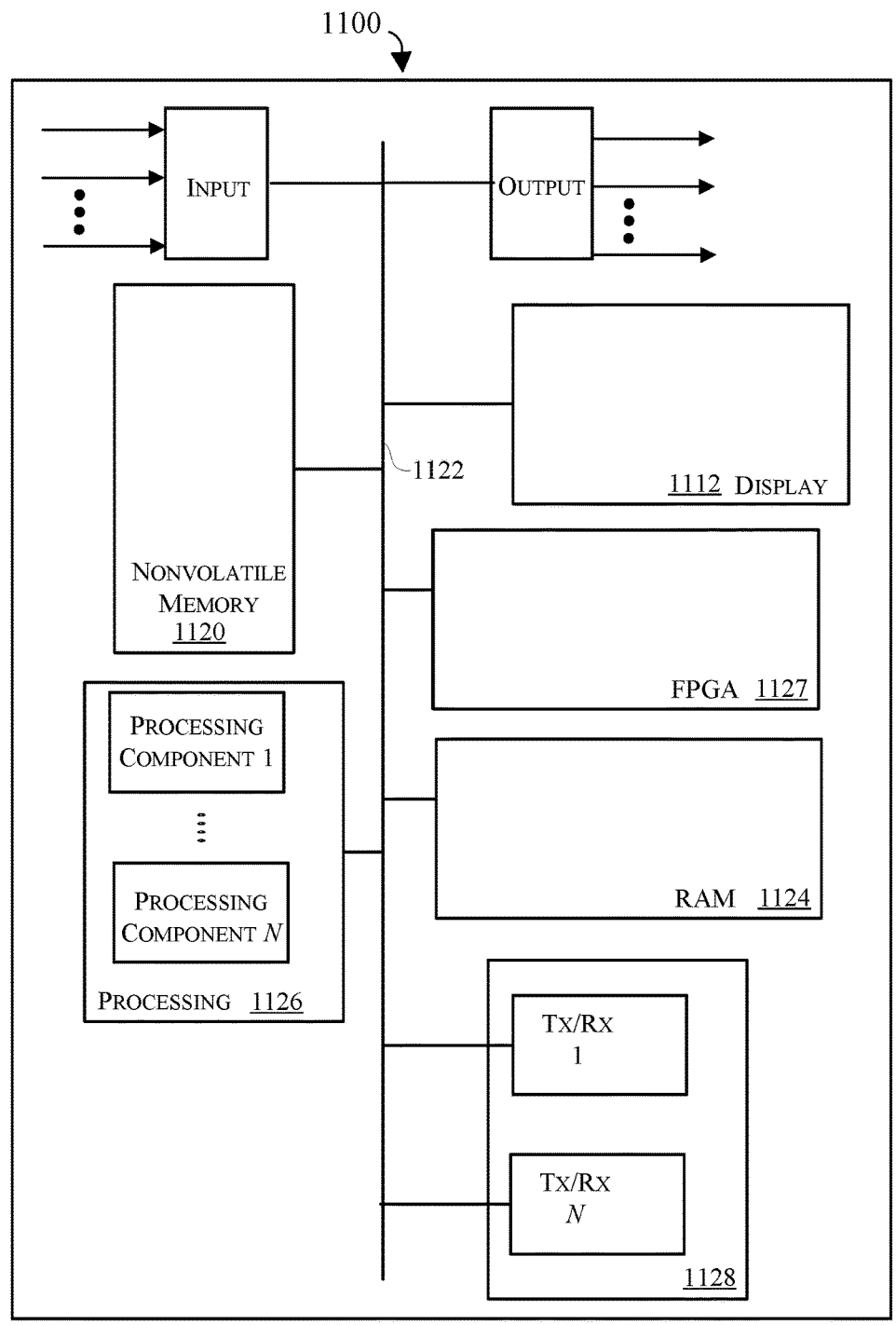
FIG. 11 is a block diagram depicting physical components that may be used to implement additional embodiments of a control circuit in accordance with an embodiment of this disclosure.

Referring next to FIG. 11, shown is a block diagram depicting physical components that may be utilized to realize additional embodiments of a control circuit (230, 330, 435, or 535) (recall that one illustrative control circuit is described above in connection with FIG. 6). As shown, in this embodiment a display portion 1112 and nonvolatile memory 1120 are coupled to a bus 1122 that is also coupled to random access memory ("RAM") 1124, a processing portion (which includes N processing components) 1126, and a transceiver component 1128 that includes N transceivers. Although the components depicted in FIG. 11 represent physical components, FIG. 11 is not intended to be a detailed hardware diagram; thus many of the components depicted in FIG. 11 may be realized by common constructs or distributed among additional physical components. Moreover, it is contemplated that other existing and yet-to-be developed physical components and architectures may be utilized to implement the functional components described with reference to FIG. 11.

This display portion 1112 generally operates to provide a user interface for a user, and in several implementations, the display is realized by a touchscreen display. In general, the nonvolatile memory 1120 is non-transitory memory that functions to store (e.g., persistently store) data and processor executable code (including executable code that is associated with effectuating the methods described herein). In some embodiments for example, the nonvolatile memory 1120 includes bootloader code, operating system code, file system code, and non-transitory processor-executable code to facilitate the timing of switching signals (sent to the switching devices) described herein.

In many implementations, the nonvolatile memory 1120 is realized by flash memory (e.g., NAND or ONENAND memory), but it is contemplated that other memory types may be utilized as well. Although it may be possible to execute the code from the nonvolatile memory 1120, the executable code in the nonvolatile memory 1120 is typically loaded into RAM 1124 and executed by one or more of the N processing components in the processing portion 1126.

The N processing components in connection with RAM 1124 generally operate to execute the instructions stored in nonvolatile memory 1120 to effectuate a method for controlling the stacked or paralleled switch modules. For example, non-transitory processor-executable instructions to effectuate the method described with reference to FIG. 7 may be persistently stored in nonvolatile memory 1120 and executed by the N processing components in connection with RAM 1124. As one of ordinarily skill in the art will appreciate, the processing portion 1126 may include a video processor, digital signal processor (DSP), graphics processing unit (GPU), and other processing components.

The input component operates to receive signals that are indicative of aspects of the amplifier (e.g., voltage and/or current), and the output component may operate to provide the signals to control the state changes of the switch modules, as discussed above. In some embodiments (see, e.g., FIG. 6), a FPGA may be utilized in connection with the embodiment depicted in FIG. 11 to execute fast operations to control the switch modules. It is also contemplated that the components depicted in FIG. 11 may be implemented as part of a FPGA to provide programmable capabilities to the FPGA.

The depicted transceiver component 1128 includes N transceiver chains, which may be used for communicating with external devices via wireless or wireline networks. Each of the N transceiver chains may represent a transceiver associated with a particular communication scheme.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A radio-frequency (RF) amplifier, comprising:
a plurality of switch modules connected in a cascade configuration, the plurality of switch modules being divided into at least two sets, each set corresponding to a distinct direct-current (DC) voltage, each switch module including:
a plurality of switching devices electrically connected in one of a full-bridge and a half-bridge circuit, each switching device having an "on" state and an "off" state; and
a DC voltage source electrically connected with the plurality of switching devices, the DC power source having a peak voltage equal to the distinct peak DC voltage corresponding to the set to which that switch module belongs; and
a control circuit configured to:
determine an output voltage of the RF amplifier over each of a plurality of switching intervals;
identify a combination of switching devices within each set of switch modules that, when switched, produce the determined output voltage for each switching interval; and
switch the switching devices in the identified combination within each switching interval wherein the switching devices in the switch modules change state at a frequency that is a multiple of an output frequency of the RF amplifier, wherein the multiple is chosen such that a first non-zero-amplitude harmonic of the output frequency remains above a fixed predetermined frequency that is higher than a maximum output frequency the RF amplifier is designed to generate.

2. The radio frequency (RF) amplifier of claim 1, wherein there is an output frequency of the RF amplifier $f_{k_1}$ above which the switching-device means change state twice within each output cycle and a decreasing sequence of frequencies $\{f_{k_1}, f_{k_2}, \ldots, f_{k_N}\}$ such that the switching-device means change state $2 \times k_{(m+1)}$ times within each output cycle for output frequencies between $f_{k_{(m+1)}}$ and $f_{k_m}$ for $m \in \{1, 2, \ldots, N-1\}$.

3. The RF amplifier of claim 1, wherein the control circuit is configured to:
identify a combination of least-recently-switched switching devices within each set of switch modules that, when switched to an opposite state, will produce the determined output voltage; and
switch to an opposite state, at the next switching interval, the switching devices in the identified combination.

4. The RF amplifier of claim 1, further comprising:
one of a low-pass filter and a band-pass filter electrically connected between output terminals of the RF amplifier and a load.

5. The RF amplifier of claim 1, wherein the switching devices include GaN high-electron-mobility-transistor (HEMT) devices.

6. The RF amplifier of claim 1, wherein $k_2$ equals 3.

7. The RF amplifier of claim 1, wherein hysteresis is applied to the values of $\{f_{k_1}, f_{k_2}, \ldots, f_{k_N}\}$ to increase the stability of a ratio between the output frequency of the RF amplifier and a frequency at which the switching devices are switched.

8. The RF amplifier of claim 1, wherein the control circuit includes a field-programmable gate array (FPGA).

9. The RF amplifier of claim 1, wherein the control circuit includes a non transitory, tangible, computer-readable storage medium containing program instructions executable by one or more processing elements.

10. A non-transitory computer-readable medium comprising instructions stored thereon, for execution by a processor, or for configuring a field programmable gate array, to control a plurality of switch modules of an RF amplifier connected in a cascade configuration, the plurality of switch modules being divided into at least two sets, each set corresponding to a distinct direct-current (DC) voltage, the instructions include instructions for:
determining an output voltage of the RF amplifier over each of a plurality of switching intervals;
identifying a combination of switching devices within each set of switch modules that, when switched, will produce the determined output voltage for each switching interval; and
switching, in each of the switch modules, a plurality of switching devices in the identified combination within each switching interval wherein the switching devices in the switch modules change state at a frequency that is a multiple of an output frequency of the RF amplifier, wherein the multiple is chosen such that a first non-zero-amplitude harmonic of the output frequency remains above a fixed predetermined frequency that is higher than a maximum output frequency the RF amplifier is designed to generate.

11. The non-transitory computer-readable medium of claim 10, wherein there is an output frequency of the RF amplifier above which the switching devices change state twice within each output cycle and a decreasing sequence of frequencies $\{f_{k_1}, f_{k_2}, \ldots, f_{k_N}\}$ such that the switching devices change state $2 \times k_{(m+1)}$ times within each output cycle for output frequencies between $f_{k_{(m+1)}}$ and $f_{k_m}$ for $m \in \{1, 2, \ldots, N-1\}$.

12. The non-transitory computer-readable medium of claim 10, wherein the instructions include instructions to:
   identify a combination of least-recently-switched switching devices within each set of switch modules that, when switched to an opposite state, will produce the determined output voltage; and
   switch to an opposite state, at the next switching interval, the switching devices in the identified combination.

13. The non-transitory computer-readable medium of claim 11, wherein $k_2$ equals 3.

14. The non-transitory computer-readable medium of claim 11, wherein the instructions include instructions to apply hysteresis to the values of $\{f_{k_1}, f_{k_2}, \ldots, f_{k_N}\}$ to increase the stability of a ratio between the output frequency of the RF amplifier and a frequency at which the switching devices are switched.

15. A method for controlling a plurality of switch modules of an RF amplifier connected in a cascade configuration, the plurality of switch modules being divided into at least two sets, each set corresponding to a distinct direct-current (DC) voltage, the instructions include instructions for:
   determining an output voltage of the RF amplifier over each of a plurality of switching intervals;
   identifying a combination of switching devices within each set of switch modules that, when switched, will produce the determined output voltage for each switching interval; and
   switching, in each of the switch modules, a plurality of switching devices in the identified combination within each switching interval wherein the switching devices in the switch modules change state at a frequency that is a multiple of an output frequency of the RF amplifier, wherein the multiple is chosen such that a first non-zero-amplitude harmonic of the output frequency remains above a fixed predetermined frequency that is higher than a maximum output frequency the RF amplifier is designed to generate.

16. The method of claim 15, wherein there is an output frequency of the RF amplifier above which the switching devices change state twice within each output cycle and a decreasing sequence of frequencies $\{f_{k_1}, f_{k_2}, \ldots, f_{k_N}\}$ such that the switching devices change state $2 \times k_{(m+1)}$ times within each output cycle for output frequencies between $f_{k_{(m+1)}}$ and $f_{k_m}$ for $m \in \{1, 2, \ldots, N-1\}$.

17. The method of claim 15, wherein the instructions include instructions to:
   identify a combination of least-recently-switched switching devices within each set of switch modules that, when switched to an opposite state, will produce the determined output voltage; and
   switch to an opposite state, at the next switching interval, the switching devices in the identified combination.

18. The method of claim 16, wherein $k_2$ equals 3.

19. The method of claim 16, wherein the instructions include instructions to apply hysteresis to the values of $\{f_{k_1}, f_{k_2}, \ldots, f_{k_N}\}$ to increase the stability of a ratio between the output frequency of the RF amplifier and a frequency at which the switching devices are switched.

* * * * *